US011362116B2

United States Patent
Wu

(10) Patent No.: US 11,362,116 B2
(45) Date of Patent: Jun. 14, 2022

(54) DISPLAY PANEL WITH BENDABLE EDGE PORTION AND DISPLAY DEVICE INCLUDING DISPLAY PANEL THEREOF

(71) Applicant: Wuhan China Star Optoelectronics Semiconductor Display Technology Co., Ltd., Wuhan (CN)

(72) Inventor: Shaojing Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 275 days.

(21) Appl. No.: 16/632,919

(22) PCT Filed: Dec. 9, 2019

(86) PCT No.: PCT/CN2019/123980
§ 371 (c)(1),
(2) Date: Jan. 22, 2020

(87) PCT Pub. No.: WO2021/031463
PCT Pub. Date: Feb. 25, 2021

(65) Prior Publication Data
US 2021/0366949 A1 Nov. 25, 2021

(30) Foreign Application Priority Data
Aug. 21, 2019 (CN) .......................... 201910773828.3

(51) Int. Cl.
*H01L 27/12* (2006.01)
*H01L 27/32* (2006.01)

(52) U.S. Cl.
CPC ...... *H01L 27/1244* (2013.01); *H01L 27/1218* (2013.01); *H01L 27/3276* (2013.01)

(58) Field of Classification Search
CPC ............. H01L 27/1244; H01L 27/1218; H01L 27/3276; H01L 27/3244; H01L 27/3248; H01L 27/3262
See application file for complete search history.

(56) References Cited

U.S. PATENT DOCUMENTS

2021/0384230 A1* 12/2021 Feng .................. H01L 27/1218

FOREIGN PATENT DOCUMENTS

| CN | 104103669 | 10/2014 |
|---|---|---|
| CN | 105977400 | 9/2016 |
| CN | 109410764 | 3/2019 |
| CN | 109887973 | 6/2019 |
| CN | 108122497 | 8/2021 |
| WO | WO-2020118931 A1 * | 6/2020 |

* cited by examiner

Primary Examiner — John P. Dulka

(57) ABSTRACT

The disclosure provides a display panel including a substrate layer, a thin film transistor (TFT) layer, and a gate on array (GOA) drive circuit. The TFT layer is disposed on the substrate layer, and a bending region is disposed on at least one side of the substrate layer near the TFT layer. The GOA drive circuit is disposed on the substrate layer, and the bending region is disposed between at least one side of the TFT layer and the GOA drive circuit. The auxiliary circuit is disposed on the substrate layer and is disposed correspondingly to the bending region.

17 Claims, 8 Drawing Sheets

DISPLAY PANEL WITH BENDABLE EDGE PORTION AND DISPLAY DEVICE INCLUDING DISPLAY PANEL THEREOF

RELATED APPLICATIONS

This application is a National Phase of PCT Patent Application No. PCT/CN2019/123980 having International filing date of Dec. 9, 2019, which claims the benefit of priority of Chinese Patent Application No. 201910773828.3 filed on Aug. 21, 2019. The contents of the above applications are all incorporated by reference as if fully set forth herein in their entirety.

FIELD AND BACKGROUND OF THE INVENTION

The present disclosure relates to the field of display technology and, more particularly, relates to a display panel and a display device.

With development of active-matrix organic light-emitting diode (AMOLED) display panel technology, narrow bezel AMOLED display panels are gaining popularity. However, due to various factors, bezels of current AMOLED display panels are still rather large, which cannot satisfy user requirements.

Regarding a technical problem, bezels of current AMOLED display panels are rather large, which cannot satisfy user requirements.

SUMMARY OF THE INVENTION

An embodiment of the present disclosure provides a display panel and a display device to solve the problem that bezels of display panels are too large.

In one aspect, an embodiment of the present disclosure provides a display panel, including: a substrate layer; a thin film transistor (TFT) layer, wherein the TFT layer is disposed on the substrate layer, and a bending region is disposed on at least one side of the substrate layer near the TFT layer; a gate on array (GOA) drive circuit, wherein the GOA drive circuit is disposed on the substrate layer and is disposed beside at least one side of the TFT layer, and the bending region is disposed between the GOA drive circuit and the TFT layer; and an auxiliary circuit, wherein the auxiliary circuit is disposed on the substrate layer and is disposed correspondingly to the bending region.

The GOA drive circuit is connected to a gate wire of the TFT layer by the auxiliary circuit.

In the display panel provided by the embodiment of the present disclosure, the substrate layer includes a substrate and a first insulating layer which are sequentially stacked.

A side of the substrate layer near the auxiliary circuit is provided with a plurality of first notches, and the first notches are defined in the first insulating layer in the bending region.

In the display panel provided by the embodiment of the present disclosure, the auxiliary circuit is disposed along a surface of the substrate layer and inner surfaces of the first notches.

In the display panel provided by the embodiment of the present disclosure, the substrate layer includes a substrate and a first insulating layer which are sequentially stacked.

A side of the substrate layer near the auxiliary circuit is provided with a second notch, and the second notch is defined in the first insulating layer in the bending region. The second notch is filled with an organic layer.

In the display panel provided by the embodiment of the present disclosure, the auxiliary circuit is disposed along a surface of the substrate layer and a surface of the organic layer.

In the display panel provided by the embodiment of the present disclosure, the auxiliary circuit includes a plurality of auxiliary circuit wires connected to the GOA drive circuit and the gate wire of the TFT layer.

The auxiliary circuit wires in the bending region are arranged in wires with a single row of holes, wires with multiple rows of holes, wavy wires, or bent wires.

In the display panel provided by the embodiment of the present disclosure, the display panel includes: a VSS wire, wherein the VSS wire is disposed correspondingly to the bending region, and a second insulating layer is disposed between the VSS wire and the auxiliary circuit.

In the display panel provided by the embodiment of the present disclosure, the display panel includes: a planarization layer, wherein the planarization layer covers the TFT layer, the VSS wire, and the substrate layer, and a through hole is defined in the planarization layer and exposes the VSS wire; and an anode layer, wherein the anode layer is disposed on the planarization layer and is connected to the VSS wire by the through hole; and a cathode layer. The cathode layer is disposed on the anode layer and is connected to the anode layer.

In the display panel provided by the embodiment of the present disclosure, the display panel includes: a planarization layer, wherein the planarization layer covers the TFT layer, the VSS wire, and the substrate layer, and a through hole is defined in the planarization layer and exposes the VSS wire; and a cathode layer, wherein the cathode layer is disposed on the planarization layer and is connected to the VSS wire by the through hole.

In the display panel provided by the embodiment of the present disclosure, the VSS wire is arranged in a wire with a single row of holes, a wire with multiple rows of holes, a wavy wire, or a bent wire.

In another aspect, the present disclosure provides a display device, including a display panel. The display panel includes: a substrate layer; a thin film transistor (TFT) layer, wherein the TFT layer is disposed on the substrate layer, and a bending region is disposed on at least one side of the substrate layer near the TFT layer; a gate on array (GOA) drive circuit, wherein the GOA drive circuit is disposed on the substrate layer and is disposed beside at least one side of the TFT layer, and the bending region is disposed between the GOA drive circuit and the TFT layer; and an auxiliary circuit, wherein the auxiliary circuit is disposed on the substrate layer and is disposed correspondingly to the bending region. The GOA drive circuit is connected to a gate wire of the TFT layer by the auxiliary circuit.

In the display device provided by the embodiment of the present disclosure, the substrate layer includes a substrate and a first insulating layer which are sequentially stacked.

A side of the substrate layer near the auxiliary circuit is provided with a plurality of first notches, and the first notches are defined in the first insulating layer in the bending region.

In the display device provided by the embodiment of the present disclosure, the auxiliary circuit is disposed along a surface of the substrate layer and inner surfaces of the first notches.

In the display device provided by the embodiment of the present disclosure, the substrate layer includes a substrate and a first insulating layer which are sequentially stacked.

A side of the substrate layer near the auxiliary circuit is provided with a second notch, and the second notch is defined in the first insulating layer in the bending region. The second notch is filled with an organic layer.

In the display device provided by the embodiment of the present disclosure, the auxiliary circuit is disposed along a surface of the substrate layer and a surface of the organic layer.

In the display device provided by the embodiment of the present disclosure, the auxiliary circuit includes a plurality of auxiliary circuit wires connected to the GOA drive circuit and the gate wire of the TFT layer.

The auxiliary circuit wires in the bending region are arranged in wires with a single row of holes, wires with multiple rows of holes, wavy wires, or bent wires.

In the display device provided by the embodiment of the present disclosure, the display panel includes: VSS wire, wherein the VSS wire is disposed correspondingly to the bending region, and a second insulating layer is disposed between the VSS wire and the auxiliary circuit.

In the display device provided by the embodiment of the present disclosure, the display panel includes: a planarization layer, wherein the planarization layer covers the TFT layer, the VSS wire, and the substrate layer, and a through hole is defined in the planarization layer and exposes the VSS wire; an anode layer, wherein the anode layer is disposed on the planarization layer and is connected to the VSS wire by the through hole; and a cathode layer, wherein the cathode layer is disposed on the anode layer and is connected to the anode layer.

In the display device provided by the embodiment of the present disclosure, the display panel includes: planarization layer, wherein the planarization layer covers the TFT layer, the VSS wire, and the substrate layer, and a through hole is defined in the planarization layer and exposes the VSS wire; and a cathode layer, wherein the cathode layer is disposed on the planarization layer and is connected to the VSS wire by the through hole.

In the display device provided by the embodiment of the present disclosure, the VSS wire is arranged in a wire with a single row of holes, a wire with multiple rows of holes, a wavy wire, or a bent wire.

Regarding beneficial effects: A display panel provided by an embodiment of the present disclosure includes a substrate layer, a TFT layer, a GOA drive circuit, and an auxiliary circuit. The TFT layer is disposed on the substrate layer, and a bending region is disposed on at least one side of the substrate layer near the TFT layer. The GOA drive circuit is disposed on the substrate layer and is disposed beside at least one side of the TFT layer, and the bending region is disposed between the GOA drive circuit and the TFT layer. The auxiliary circuit is disposed on the substrate layer and is disposed correspondingly to the bending region. The GOA drive circuit is connected to a gate wire of the TFT layer by the auxiliary circuit. In the present disclosure, the auxiliary circuit is disposed between the TFT layer and the GOA drive circuit, which can reduce widths of bezels of the display panel.

DESCRIPTION OF SPECIFIC EMBODIMENTS OF THE INVENTION

Hereinafter, preferred embodiments of the present disclosure will be described with reference to the accompanying drawings to exemplify the embodiments of the present disclosure, which can fully describe the technical contents of the present disclosure to make the technical content of the present disclosure clearer and easier to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

An embodiment of the present disclosure provides a display panel and a display device which are described respectively below in detail.

Figure 1:
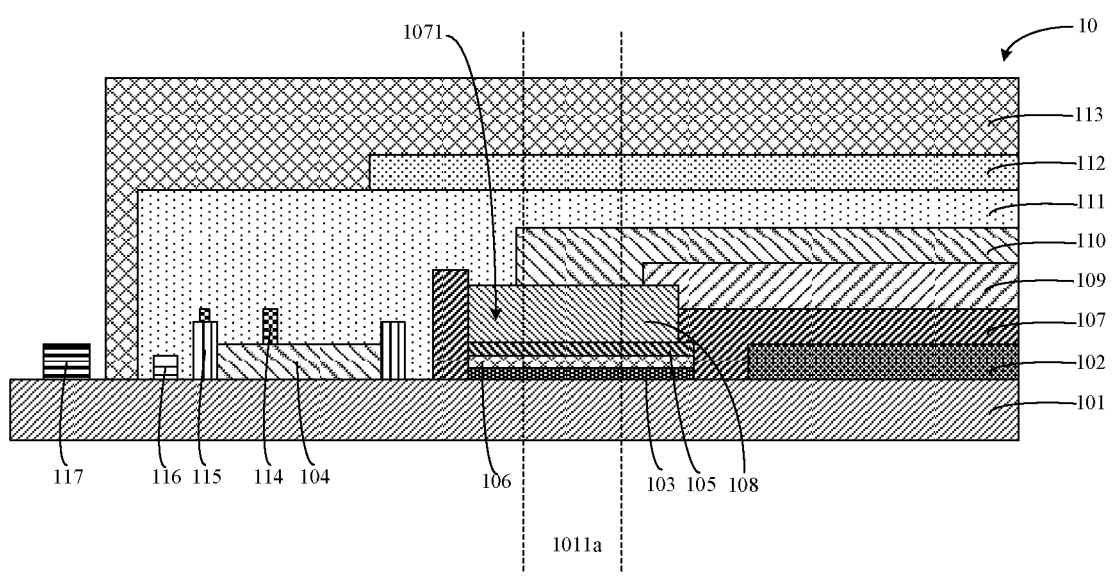
FIG. 1 is a schematic structural view showing a display panel provided by an embodiment of the present disclosure.

Referring to FIG. 1, FIG. 1 is a schematic structural view showing a display panel provided by an embodiment of the present disclosure. A display panel 10 may include a substrate layer 101, a thin film transistor (TFT) layer 102, an auxiliary circuit 103, and a gate on array (GOA) circuit 104.

The substrate layer 101 may be made of any insulating material with flexible features, for example, the substrate layer 101 may be made of polymers such as polyimide (PI), polycarbonate (PC), polyethersulfone (PES), polyethylene terephthalate (PET), polyethylene naphthalate (PEN), polyarylate (PAR), or fibre-reinforced plastic (FRP).

The TFT layer 102 is disposed on the substrate layer 101. Moreover, the TFT layer 102 is disposed beside a side of a bending region 1011a. The TFT layer 102 may include films such as a source/drain layer, a gate layer, and a gate insulating layer. It should be understood that the GOA drive circuit 104 is a gate drive control circuit.

Figure 9:
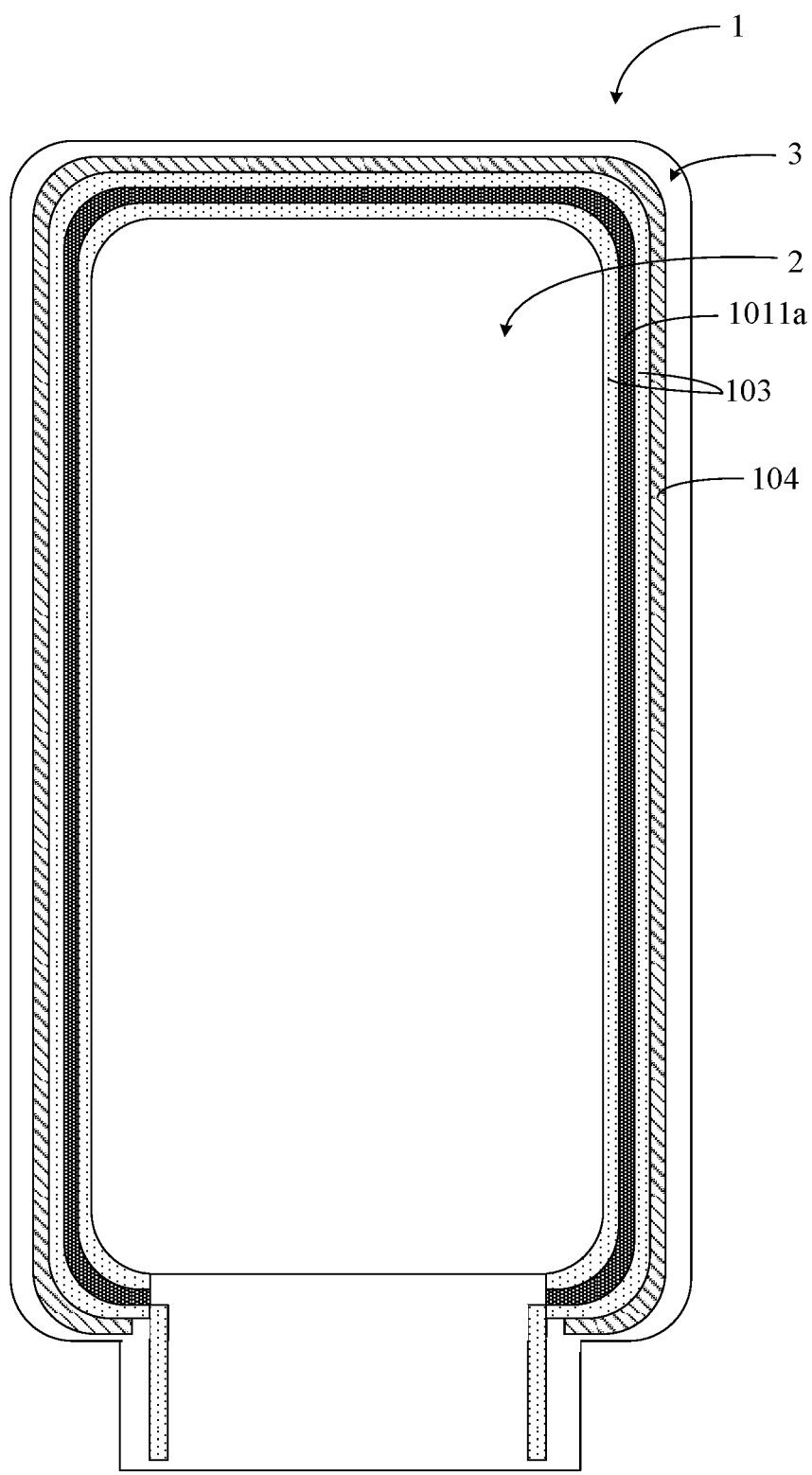
FIG. 9 is a schematic structural view showing a display device provided by an embodiment of the present disclosure.
Figure 10:
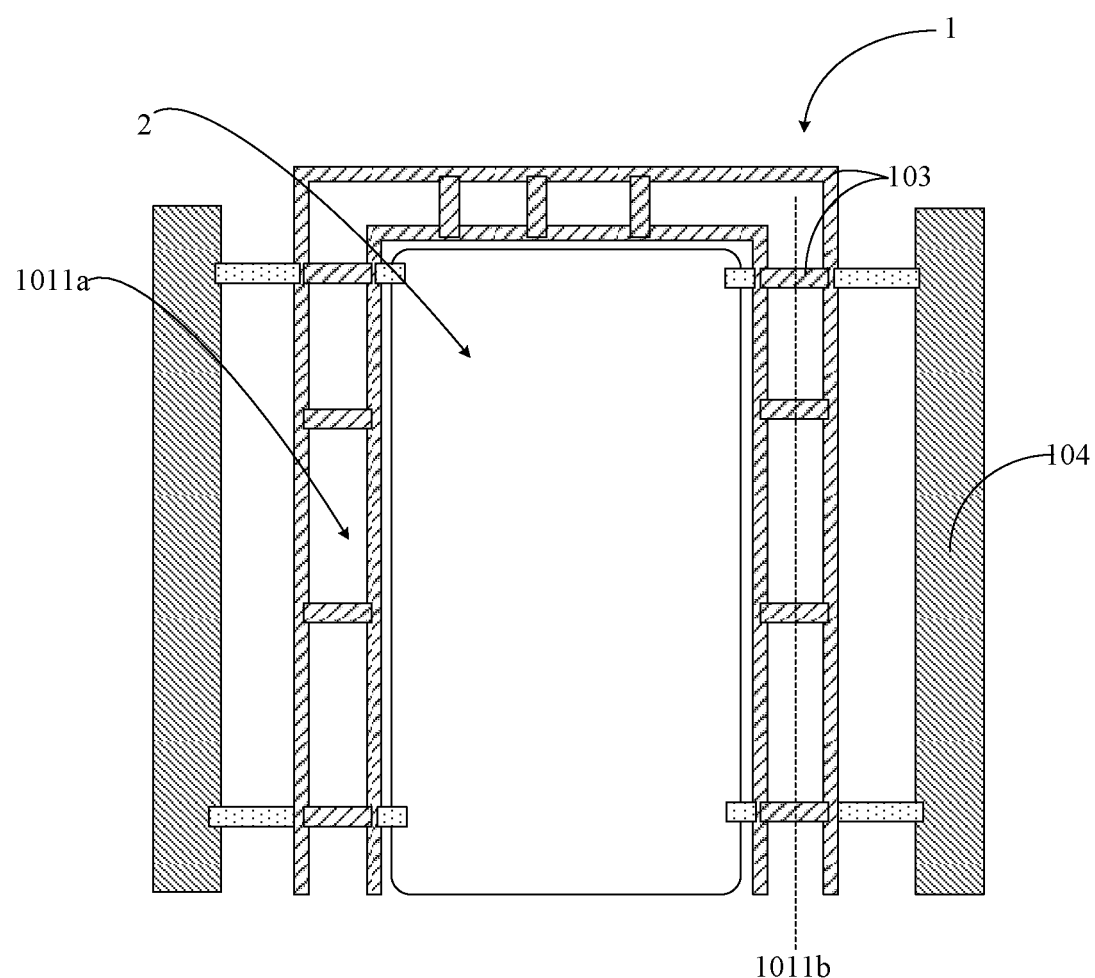
FIG. 10 is another schematic structural view showing a display device provided by an embodiment of the present disclosure.

In some embodiments, to improve flexibility of the display panel 10, the bending region 1011a may be disposed on at least one side of the substrate layer 101 near the TFT layer 102. It should be understood that the TFT layer 102 may include a top side, a bottom side, a left side, and a right side. Specifically, as shown in FIG. 9 or FIG. 10, the TFT layer 102 is disposed in a display region 2.

It should be noted that in the present embodiment, the bending region 1011*a* may be disposed beside at least one of the top side, the left side, or the right side of the TFT layer 102. However, there is no need to dispose the bending region 1011*a* beside the bottom side of the TFT layer 102. Preferably, in the present embodiment, the bending region 1011*a* may be disposed beside the top side, the left side, and the right side of the TFT layer 102.

It should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counter-clockwise", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

The GOA drive circuit 104 is disposed on the substrate layer 101. Moreover, the GOA drive circuit 104 is disposed beside at least one side of TFT layer 102. It should be understood that the GOA drive circuit 104 may be disposed beside at least one of the top side, the left side, or the right side of the TFT layer 102. Meanwhile, it should be noted that the bending region 1011*a* is disposed between the GOA drive circuit 104 and the TFT layer 102.

The auxiliary circuit 103 is disposed on the substrate layer 101. Moreover, the auxiliary circuit 103 is disposed correspondingly to the bending region 1011*a*. The auxiliary circuit 103 may be configured to connect with the TFT layer 102 and the GOA drive circuit 104. The GOA drive circuit 104 may be connected to a gate wire of the TFT layer 102 by the auxiliary circuit 103. It should be noted that the auxiliary circuit 103 may include a plurality of auxiliary circuit wires connected to the GOA drive circuit 104 and the gate wire of the TFT layer 102.

It should be understood that widths of bezels of the display panel 10 are same as a distance from a cutting edge of the auxiliary circuit 103 to a light-emitting region of the TFT layer 102. However, in conventional technology, the GOA drive circuit 104 is disposed between the TFT layer 102 and the auxiliary circuit 103. Consequently, widths of bezels of the display panel 10 provided by the present disclosure are less than widths of bezels of display panels of the conventional technology.

Figure 2:
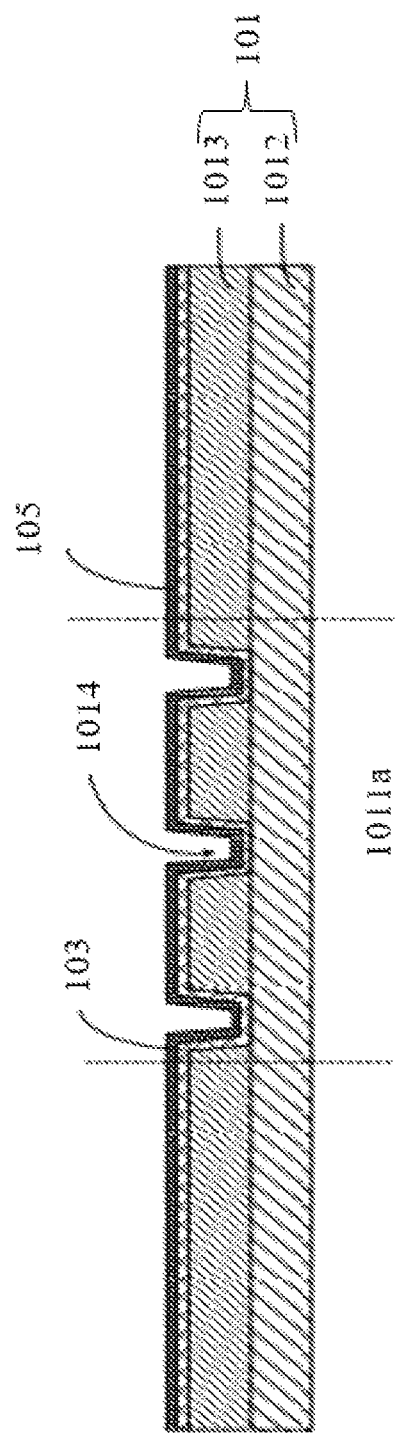
FIG. 2 is a schematic structural view showing a bending region of a display panel provided by an embodiment of the present disclosure.

In some embodiments, referring to FIG. 2, the display panel 10 may further include a VSS wire 105. The substrate layer 101 may include a substrate 1012 and a first insulating layer 1013 which are sequentially stacked. A plurality of first notches 1014 are defined on a side of the substrate layer 101 near the auxiliary circuit 103. It should be noted that the first notches 1014 are defined in the first insulating layer 1013 of the substrate layer 101 in the bending region 1011*a*. It should be understood that the VSS is usually a common ground voltage.

The auxiliary circuit 103 may be disposed along a surface of the substrate layer 101 and inner surfaces of the first notches 1014. That is, the auxiliary circuit 103 may cover the surface of the substrate layer 101 and the inner surfaces of the first notches 1014. Meanwhile, it should be understood that the auxiliary circuit 103 is undulating, which is beneficial to realize a bendable auxiliary circuit 103 and reduce risk of breakage of auxiliary circuit 103 when edges of the display panel 10 are curvedly bent. It should be noted that a bending shape of the auxiliary circuit 103 may be multiple. The bending shape of the auxiliary circuit 103 is mainly decided by shapes of the inner surfaces of the first notches 1014.

Meanwhile, the VSS wire 105 may be disposed in the same way as in the auxiliary circuit 103 to improve flexibility of the VSS wire 105. That is, the VSS wire 105 may be disposed on the auxiliary circuit 103. Moreover, the VSS wire 105 disposed on the bending region 1011*a* may be disposed along a top surface of the auxiliary circuit 103.

Figure 3:
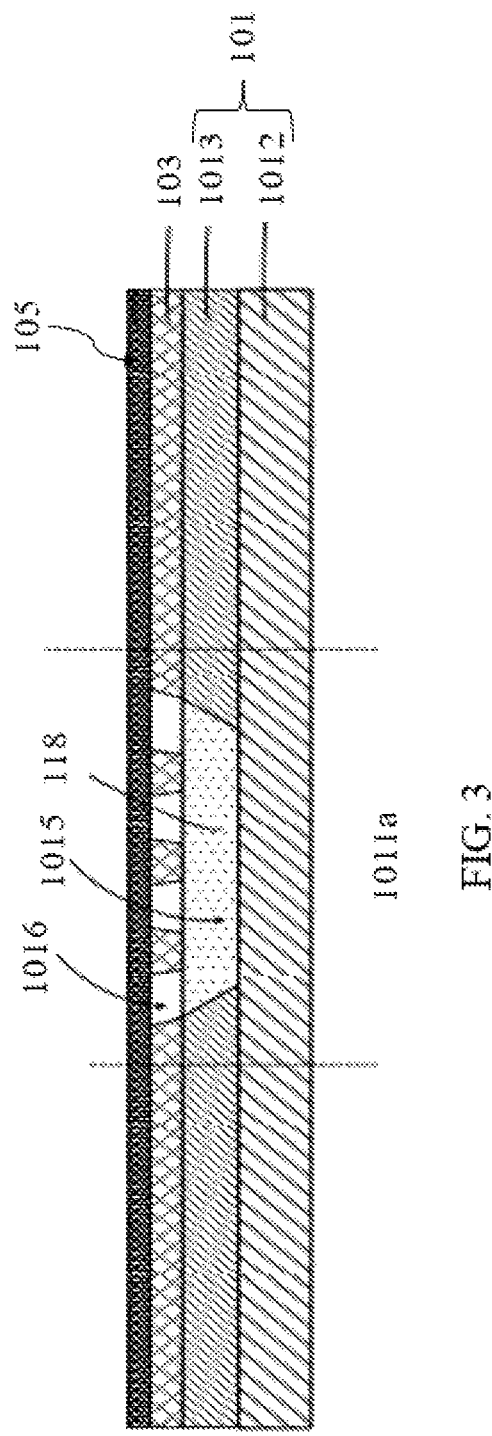
FIG. 3 is another schematic structural view showing a bending region of a display panel provided by an embodiment of the present disclosure.

In some embodiments, referring to FIG. 3, the display panel 10 may further include the VSS wire 105, and the VSS wire 105 is disposed on the auxiliary circuit 103. The substrate layer 101 may include the substrate 1012 and the first insulating layer 1013 which are sequentially stacked. A second notch 1015 may be defined in a side of the substrate layer 101 near the auxiliary circuit 103. It should be noted that the second notch 1015 is defined in the first insulating layer 1013 of the substrate layer 101 in the bending region 1011*a*. The second notch 1015 is filled with an organic layer 118. Meanwhile, the auxiliary circuit 103 is disposed along the surface of the substrate layer 101 and a surface of the organic layer 118.

When the edges of the display panel 10 are curvedly bent, the organic layer 118 can release applied forces generated by the auxiliary circuit 103 which is bent, improve flexibility of the auxiliary circuit 103, and reduce risk of breakage of the auxiliary circuit 103 which is bent.

To further improve flexibilities of the auxiliary circuit 103 and the VSS wire 105, in some embodiments, the auxiliary circuit 103 in the bending region 1011*a* may be dug to form a plurality of third notches 1016. The third notches 1016 are beneficial to release applied forces in the auxiliary circuit 103 and the VSS wire 105.

Figure 4:
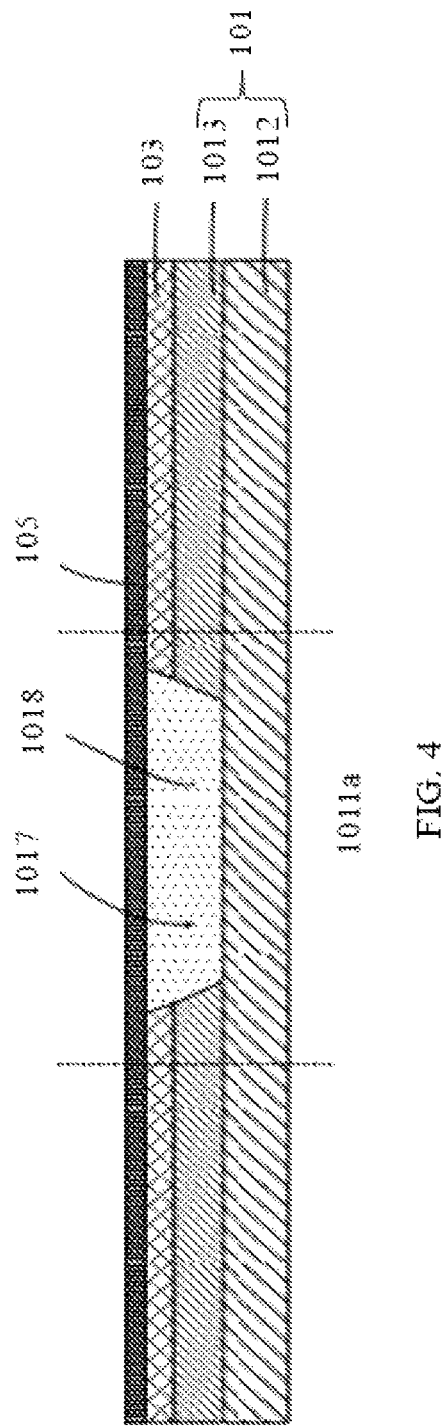
FIG. 4 is yet another schematic structural view showing a bending region of a display panel provided by an embodiment of the present disclosure.

In some embodiments, referring to FIG. 4, the display panel 10 may further include the VSS wire 105, and the VSS wire 105 is disposed on the auxiliary circuit 103. The substrate layer 101 may include the substrate 1012 and the first insulating layer 1013 which are sequentially stacked. The auxiliary circuit 103 may be provided with the fourth notches 1017 extending and passing through the auxiliary circuit 103 and the first insulating layer 1013. The fourth notches 1017 may be beneficial to release applied forces in the VSS wire 105 and the auxiliary circuit 103.

To further improve flexibilities of the auxiliary circuit 103 and the VSS wire 105, the fourth notches 1017 may be filled with an organic material to form an organic layer 1018. The organic layer 1018 is beneficial to release applied forces in the auxiliary circuit 103 and the VSS wire 105.

Figure 5:
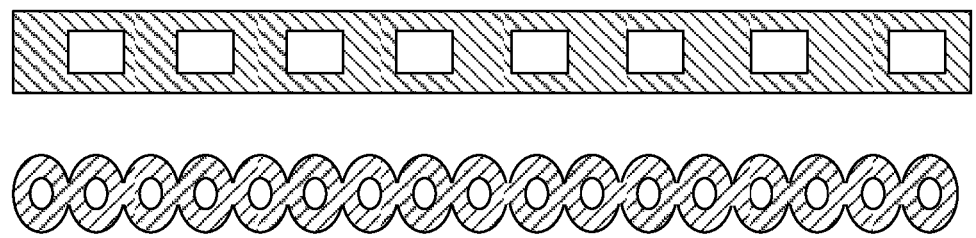
FIG. 5 is a schematic structural view showing an auxiliary circuit and/or a VSS wire provided by an embodiment of the present disclosure.
Figure 6:
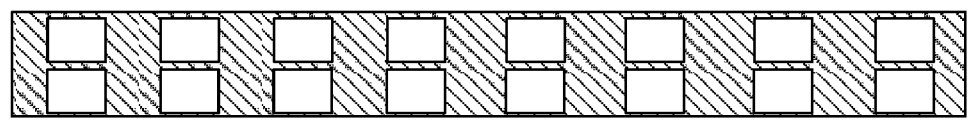
FIG. 6 is another schematic structural view showing an auxiliary circuit and/or a VSS wire provided by an embodiment of the present disclosure.
Figure 7:
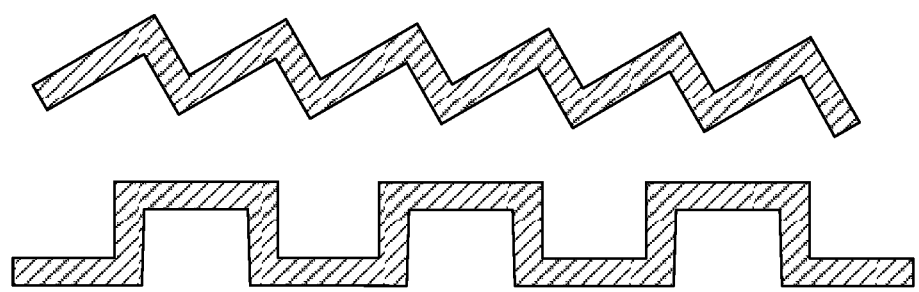
FIG. 7 is yet another schematic structural view showing an auxiliary circuit and/or a VSS wire provided by an embodiment of the present disclosure.

To further improve flexibilities of the auxiliary circuit 103 and the VSS wire 105, in some embodiments, the auxiliary circuit 103 and the VSS wire 105 may be designed to be flexible. In some embodiments, the auxiliary circuit 103 and the VSS wire 105 may be designed to a wire with a single row of holes as shown in FIG. 5, a wire with multiple rows of holes as shown in FIG. 6, a wavy wire as shown in FIG. 7, or a bent wire as shown in FIG. 7. It should be noted that shapes of the holes, the wavy wire, and the bent wire of the auxiliary circuit 103 or the VSS wire 105 are not limited to the drawings.

Specifically, the auxiliary circuit 103 with a single row of holes or the auxiliary circuit 103 with multiple rows of holes may be formed on the substrate layer 101 by a mask, and the VSS wire 105 with a single row of holes or the VSS wire 105 with multiple rows of holes is formed on the auxiliary circuit 103 by a mask. Alternatively, the auxiliary circuit 103 on the substrate layer 101 is designed to be a wavy wire, and the VSS wire 105 on the auxiliary circuit 103 is designed to be a wavy wire. By designing the auxiliary circuit 103 and the VSS wire 105 to be a wire with a single row of holes, a wire with multiple rows of holes, or a wavy wire, flexibilities of the auxiliary circuit 103 and the VSS wire 105 may be improved.

In some embodiments, to improve efficiency of a manufacturing process, auxiliary circuit wires of the auxiliary circuit 103 in the bending region 1011a may be designed to be wires with a single row of holes, wires with multiple rows of holes, wavy wires, or bent wires, whereas auxiliary circuit wires of the auxiliary circuit 103 outside the bending region 1011a may be disposed following a conventional process.

Similarly, the VSS wire 105 in the bending region 1011a may be designed to be a wire with a single row of holes, a wire with multiple rows of holes, a wavy wire, or a bent wire, whereas the VSS wire 105 outside the bending region 1011a may be disposed following a conventional process.

It should be understood that a second insulating layer 106 may be disposed between the auxiliary circuit 103 and the VSS wire 105. The second insulating layer 106 is configured to isolate the auxiliary circuit 103 from the VSS wire 105, preventing auxiliary circuit 103 and the VSS wire 105 from a short circuit because of connection.

Referring to FIG. 1, the display panel 10 provided by an embodiment of the present disclosure may further include a planarization layer 107, an anode layer 108, and a cathode layer 109.

The planarization layer 107 covers the TFT layer 102, the VSS wire 105, and the substrate layer 101. Moreover, a through hole 1071 is defined in the planarization layer 107 and exposes the VSS wire 105.

The anode layer 108 is disposed on the planarization layer 107. Furthermore, the anode layer 108 is connected to the VSS wire 105 by the through hole 1071.

The cathode layer 109 is disposed on the planarization layer 107 and a portion of the anode layer 108. Furthermore, the cathode layer 109 is connected to the anode layer 108.

It should be noted that a thickness of the cathode layer 109 is less than a thickness of the anode layer 108. Therefore, the cathode layer 109 is more flexible than the anode layer 108.

When the display panel 10 is bent, the VSS wire 105 may fail to connect with a display region of the display panel 10 because of breakage of anode layer 108, which affects display effects of the display panel 10. To prevent the above situation, referring to FIG. 8, in some embodiments, the anode layer 108 may be omitted, and the cathode layer 109 is directly connected to the VSS wire 105.

Meanwhile, the cathode layer 109 is disposed on the planarization layer 107. Moreover, the cathode layer 109 is connected to the VSS wire 105 by the through hole 1071.

Since the cathode layer 109 is more flexible than the anode layer 108, when the cathode layer 109 is directly connected to the VSS wire 105 by the through hole 1071 (the anode layer 108 is omitted), compared to a situation that the cathode layer 109 is connected to the VSS wire 105 by the anode layer 108, risk of failure of connection of the VSS wire 105 and the display region may be reduced, and display effects of the display panel 10 will not be affected.

Moreover, when the cathode layer 109 is directly connected to the VSS wire 105, compared to the situation that the cathode layer 109 is connected to the VSS wire 105 by the anode layer 108, contact resistance of the VSS wire 105 is reduced. With the contact resistance of the VSS wire 105 reduced, IR drop of the VSS wire 105 is reduced as well, thereby improving uniformity of light emitted by the display panel 10.

Figure 8:
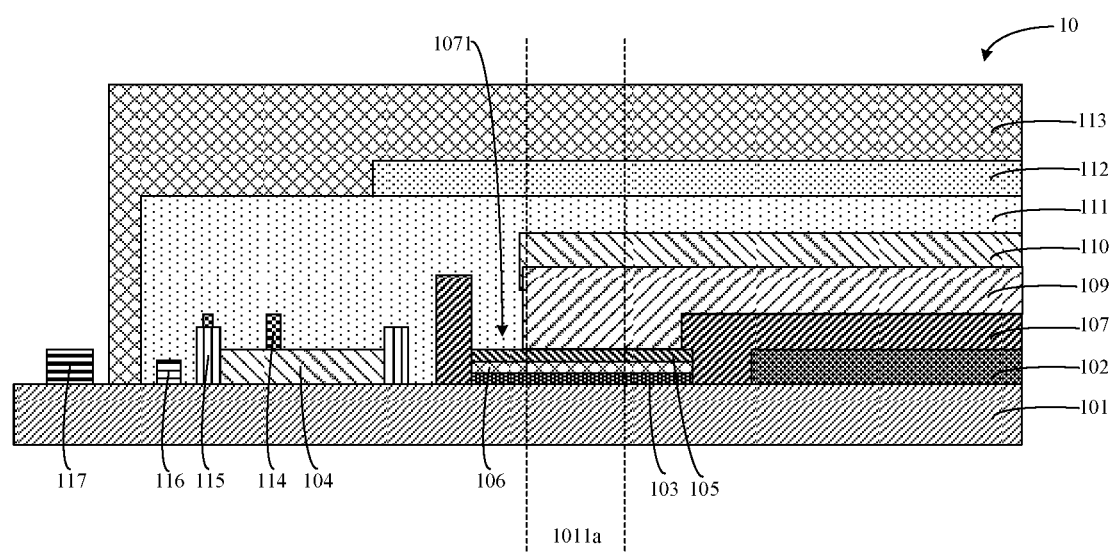
FIG. 8 is another schematic structural view showing a display panel provided by an embodiment of the present disclosure.

Referring to FIG. 1 or FIG. 8, the display panel 10 may further include a functional layer 110, a first encapsulation layer 111, a second encapsulation layer 112, a third encapsulation layer 113, a pixel defining layer 114, and a blocking wall 115.

The pixel defining layer 114 is disposed on the blocking wall 115 and the GOA drive circuit 104. The functional layer 110 is disposed on the anode layer 108 or the cathode layer 109. The first encapsulation layer 111 covers the functional layer 110, the pixel defining layer 114, the blocking wall 115, the planarization layer 107, the GOA drive circuit 104, and the substrate layer 101. The second encapsulation layer 112 is disposed on the first encapsulation layer 111. The third encapsulation layer 113 covers the second encapsulation layer 112, the first encapsulation layer 111, and the substrate layer 101.

It should be noted that the first encapsulation layer 111 and the third encapsulation layer 113 are non-organic encapsulation layers. The second encapsulation layer 112 is an organic encapsulation layer.

It should be understood that a lateral side of the GOA drive circuit 104 is prone to erosion. Therefore, an outer side of the GOA drive circuit 104 may be provided with the blocking wall 115 that is tightly attached to the GOA drive circuit 104. That is, the blocking wall 115 is tightly attached to and is surrounding the GOA drive circuit 104 to prevent the lateral side of the GOA drive circuit 104 from being eroded so that performance of the GOA drive circuit 104 will not be affected. It should be noted that a thickness of the blocking wall 115 is greater than a thickness of the GOA drive circuit 104.

In an embodiment of the present disclosure, the display panel 10 may further include a crack detection circuit 116 and a crack preventing device 117.

The crack detection circuit 116 is disposed on the substrate layer 101 and is configured to detect whether cracks appear in the display panel 10. It should be noted that the TFT layer 102, the auxiliary circuit 103, and the GOA drive circuit 104 are disposed on the same side, whereas the crack detection circuit 116 is disposed on the other side. Furthermore, the crack detection circuit 116 is disposed in the first encapsulation layer 111.

The crack preventing device 117 is disposed on the substrate layer 101 and is configured to prevent cracks from appearing in the display panel 10. It should be noted that the crack protection device 117 is disposed outside the third encapsulation layer 113.

To sum up, in the display panel 10 provided by an embodiment of the present disclosure, the auxiliary circuit 103 is disposed between the TFT layer 102 and the GOA drive circuit 104, which may reduce widths of bezels of the display panel 10. Moreover, the auxiliary circuit 103 is disposed in the bending region 1011a of the substrate layer 101, which may improve flexibility of the auxiliary circuit 103, thereby further improving flexibility of the display panel 10.

An embodiment of the present disclosure further provides a display device 1, the display device 1 may include the display panel 10 of the above embodiments. As shown in FIG. 9, the display device 1 may include the display region 2 and a non-display region 3. It should be noted that the light-emitting region of the TFT layer 102 of the display panel 10 is disposed in the display region 2, whereas the auxiliary circuit 103, the bending region 1011a, and the GOA drive circuit 104 are disposed in the non-display region 3.

Referring to FIG. 10, FIG. 10 is another schematic structural view showing a display device provided by an embodiment of the present disclosure. The display device 1 may include the display panel 10 of the above embodiments. It should be noted that the TFT layer 102 is disposed in the display region 2. Meanwhile, the auxiliary circuit 103 is disposed between the display region 2 and the GOA drive circuit 104. Furthermore, the auxiliary circuit 103 is disposed correspondingly to the bending region 1011a. The bending region 1011a is provided with a cutting edge 1011b. It should be understood that widths of bezels of the display device 1 are same as a distance from the edge 1011b to the display region 2. However, in conventional technology, the GOA drive circuit 104 is disposed between the auxiliary circuit 103 and the display region 2. As a result, the widths of bezels of the display device 1 may be reduced by the present disclosure.

In summary, bezels of the display device 1 provided by an embodiment of the present disclosure are narrower, which may satisfy user requirements and improve user experience.

In the above embodiments, the focus of each embodiment is different, and for a part that is not detailed in an embodiment, reference may be made to related descriptions of other embodiments.

A display panel and a display device have been described in detail with embodiments provided by the present disclosure, which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising:
   a substrate layer;
   a thin film transistor (TFT) layer, wherein the TFT layer is disposed on the substrate layer, and a bending region is disposed on at least one side of the substrate layer near the TFT layer;
   a gate on array (GOA) drive circuit, wherein the GOA drive circuit is disposed on the substrate layer and is disposed beside at least one side of the TFT layer, and the bending region is disposed between the GOA drive circuit and the TFT layer;
   an auxiliary circuit, wherein the auxiliary circuit is disposed on the substrate layer and is disposed correspondingly to the bending region;
   a voltage source supply (VSS) wire, wherein the VSS wire is disposed correspondingly to the bending region, and a second insulating layer is disposed between the VSS wire and the auxiliary circuit;
   a planarization layer, wherein the planarization layer covers the TFT layer, the VSS wire, and the substrate layer, and a through hole is defined on the planarization layer and exposes the VSS wire; and
   a cathode layer, wherein the cathode layer is disposed on the planarization layer and is connected to the VSS wire by the through hole; and
   wherein the GOA drive circuit is connected to a gate wire of the TFT layer by the auxiliary circuit.

2. The display panel of claim 1, wherein the substrate layer comprises a substrate and a first insulating layer which are sequentially stacked; and
   a side of the substrate layer near the auxiliary circuit is provided with a plurality of first notches, and the first notches are defined in the first insulating layer in the bending region.

3. The display panel of claim 2, wherein the auxiliary circuit is disposed along a surface of the substrate layer and inner surfaces of the first notches.

4. The display panel of claim 1, wherein the substrate layer comprises a substrate and a first insulating layer which are sequentially stacked;
   a side of the substrate layer near the auxiliary circuit is provided with a second notch, and the second notch is defined in the first insulating layer in the bending region; and
   the second notch is filled with an organic layer.

5. The display panel of claim 4, wherein the auxiliary circuit is disposed along a surface of the substrate layer and a surface of the organic layer.

6. The display panel of claim 1, wherein the auxiliary circuit comprises a plurality of auxiliary circuit wires connected to the GOA drive circuit and the gate wire of the TFT layer; and
   the auxiliary circuit wires in the bending region are arranged in wires with a single row of holes, wires with multiple rows of holes, wavy wires, or bent wires.

7. The display panel of claim 1, wherein the display panel further comprises:
   a planarization layer, wherein the planarization layer covers the TFT layer, the VSS wire, and the substrate layer, and a through hole is defined on the planarization layer and exposes the VSS wire;
   an anode layer, wherein the anode layer is disposed on the planarization layer and is connected to the VSS wire by the through hole; and
   a cathode layer, wherein the cathode layer is disposed on the anode layer and is connected to the anode layer.

8. The display panel of claim 1, wherein the VSS wire is arranged in a wire with a single row of holes, a wire with multiple rows of holes, a wavy wire, or a bent wire.

9. A display device, comprising a display panel;
   wherein the display panel comprises:
   a substrate layer;
   a thin film transistor (TFT) layer, wherein the TFT layer is disposed on the substrate layer, and a bending region is disposed on at least one side of the substrate layer near the TFT layer;
   a gate on array (GOA) drive circuit, wherein the GOA drive circuit is disposed on the substrate layer and is disposed beside at least one side of the TFT layer, and the bending region is disposed between the GOA drive circuit and the TFT layer;
   an auxiliary circuit, wherein the auxiliary circuit is disposed on the substrate layer and is disposed correspondingly to the bending region;
   a voltage source supply (VSS) wire, wherein the VSS wire is disposed correspondingly to the bending region, and a second insulating layer is disposed between the VSS wire and the auxiliary circuit;
   a planarization layer, wherein the planarization layer covers the TFT layer, the VSS wire, and the substrate layer, and a through hole is defined on the planarization layer and exposes the VSS wire; and
   a cathode layer, wherein the cathode layer is disposed on the planarization layer and is connected to the VSS wire by the through hole; and
   wherein the GOA drive circuit is connected to a gate wire of the TFT layer by the auxiliary circuit.

10. The display device of claim 9, wherein the substrate layer comprises a substrate and a first insulating layer which are sequentially stacked; and a side of the substrate layer near the auxiliary circuit is provided with a plurality of first notches, and the first notches are defined in the first insulating layer in the bending region.

11. The display device of claim 10, wherein the auxiliary circuit is disposed along a surface of the substrate layer and inner surfaces of the first notches.

12. The display device of claim 9, wherein the substrate layer comprises a substrate and a first insulating layer which are sequentially stacked;

a side of the substrate layer near the auxiliary circuit is provided with a second notch, and the second notch is defined in the first insulating layer in the bending region; and the second notch is filled with an organic layer.

13. The display device of claim 12, wherein the auxiliary circuit is disposed along a surface of the substrate layer and a surface of the organic layer.

14. The display device of claim 9, wherein the auxiliary circuit comprises a plurality of auxiliary circuit wires connected to the GOA drive circuit and the gate wire of the TFT layer; and the auxiliary circuit wires in the bending region are arranged in wires with a single row of holes, wires with multiple rows of holes, wavy wires, or bent wires.

15. The display device of claim 9, wherein the display panel further comprises:

a planarization layer, wherein the planarization layer covers the TFT layer, the VSS wire, and the substrate layer, and a through hole is defined on the planarization layer and exposes the VSS wire;

an anode layer, wherein the anode layer is disposed on the planarization layer and is connected to the VSS wire by the through hole; and a cathode layer, wherein the cathode layer is disposed on the anode layer and is connected to the anode layer.

16. The display device of claim 9, wherein the VSS wire is arranged in a wire with a single row of holes, a wire with multiple rows of holes, a wavy wire, or a bent wire.

17. A display panel, comprising:

a substrate layer;

a thin film transistor (TFT) layer, wherein the TFT layer is disposed on the substrate layer, and a bending region is disposed on at least one side of the substrate layer near the TFT layer;

a gate on array (GOA) drive circuit, wherein the GOA drive circuit is disposed on the substrate layer and is disposed beside at least one side of the TFT layer, and the bending region is disposed between the GOA drive circuit and the TFT layer;

an auxiliary circuit, wherein the auxiliary circuit is disposed on the substrate layer and is disposed correspondingly to the bending region;

a voltage source supply (VSS) wire, wherein the VSS wire is disposed correspondingly to the bending region, and a second insulating layer is disposed between the VSS wire and the auxiliary circuit;

a planarization layer, wherein the planarization layer covers the TFT layer, the VSS wire, and the substrate layer, and a through hole is defined on the planarization layer and exposes the VSS wire;

an anode layer, wherein the anode layer is disposed on the planarization layer and is connected to the VSS wire by the through hole; and a cathode layer, wherein the cathode layer is disposed on the anode layer and is connected to the anode layer; and wherein the GOA drive circuit is connected to a gate wire of the TFT layer by the auxiliary circuit.

\* \* \* \* \*